(12) United States Patent
Pintos et al.

(10) Patent No.: US 11,616,293 B2
(45) Date of Patent: Mar. 28, 2023

(54) SHEET EXHIBITING DIELECTRIC OR MAGNETO-DIELECTRIC PROPERTIES

(71) Applicant: COMMISSARIAT A L'ENERGIE ATOMIQUE ET AUX ENERGIES ALTERNATIVES, Paris (FR)

(72) Inventors: Jean-François Pintos, Grenoble (FR); Mohammed Benwadih, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 426 days.

(21) Appl. No.: 16/697,443

(22) Filed: Nov. 27, 2019

(65) Prior Publication Data

US 2020/0168986 A1 May 28, 2020

(30) Foreign Application Priority Data

Nov. 28, 2018 (FR) ...................... 18 71977

(51) Int. Cl.
*H01Q 1/38* (2006.01)
*B32B 7/12* (2006.01)
(Continued)

(52) U.S. Cl.
CPC ................ *H01Q 1/38* (2013.01); *B32B 7/12* (2013.01); *H01Q 1/22* (2013.01); *H01Q 7/00* (2013.01); *H01Q 9/42* (2013.01); *H04B 1/06* (2013.01); *H05K 1/0393* (2013.01); *H05K 9/009* (2013.01); *H05K 9/0086* (2013.01); *H05K 9/0092* (2013.01)

(58) Field of Classification Search
CPC .. H04B 1/06; B32B 7/12; B32B 33/00; B32B 2457/00; B32B 2310/12; H01Q 9/42; H01Q 7/00; H01Q 1/38; H01Q 1/22; H05K 9/0092; H05K 1/0393; H05K 9/0086; H05K 3/1225; H05K 9/009; H05K 3/1233; H05K 1/165; H05K 2203/0139; H05K 2203/107; H05K 2201/10098; H05K 2201/0158; H05K 2201/0154; H05K 2201/055; H05K 2201/0145; B29C 53/562; B29C 53/04; B29K 2995/0006; B29K 2995/0008; B29L 2031/3456
See application file for complete search history.

(56) References Cited

U.S. PATENT DOCUMENTS

2010/0151797 A1* 6/2010 Viala ...................... H01Q 17/00
455/73
2011/0135884 A1* 6/2011 Lettow ................... H05K 1/095
428/174

FOREIGN PATENT DOCUMENTS

WO WO 2011/036418 A1 5/2011
WO WO 2013/154713 A1 10/2013

OTHER PUBLICATIONS

Communication from the European Patent Office in counterpart European Application No. 19211933.7, dated Feb. 15, 2021.
(Continued)

*Primary Examiner* — Graham P Smith
(74) *Attorney, Agent, or Firm* — ArentFox Schiff LLP (57) ABSTRACT

Sheet comprising a flexible support and a coating at least partially covering at least one face of the support, the support being made of a support material exhibiting dielectric properties, the coating being made of a coating material different from the support material and exhibiting magneto-dielectric properties or dielectric properties.

12 Claims, 7 Drawing Sheets

(51) Int. Cl.
*H01Q 1/22* (2006.01)
*H01Q 7/00* (2006.01)
*H01Q 9/42* (2006.01)
*H04B 1/06* (2006.01)
*H05K 1/03* (2006.01)
*H05K 9/00* (2006.01)

(56) References Cited

OTHER PUBLICATIONS

Ghaffar, F. A. et al., "A Ferrite Nano-particles Based Fully Printed Process for Tunable Microwave Components", IEEE MTT-S International Microwave Symposium (IMS), pp. 1-3, XP032941195, (2016).
French Search Report, from the French Patent Office in counterpart French Applicalion No. 1871977, dated Sep. 17, 2019.
Mosallaei, H. et al., "Engineered Meta-Substrates for Antenna Miniaturization", Electrical Engineering and Computer Science Department, University of Michigan, Ann Arbor, Ann Arbor, MI 48109-2122, URSI EMTS 2004, pp. 191-193, (2004).

* cited by examiner

SHEET EXHIBITING DIELECTRIC OR MAGNETO-DIELECTRIC PROPERTIES

CROSS-REFERENCE TO RELATED APPLICATIONS

This application claims priority to French Patent Application No. 18 71977, filed on Nov. 28, 2018. The disclosure of the priority application is incorporated in its entirety herein by reference.

TECHNICAL FIELD

The present invention relates to a sheet and a composite structure that have anisotropic dielectric or magneto-dielectric properties, as well as an electromagnetic device comprising same.

PRIOR ART

A charged electromagnetic antenna generally consists of a conductive metal part and a magneto-dielectric material, generally a ferrite, exhibiting both a relative permittivity and a relative permeability that are greater than 1.0. An electrically-conductive member, generally a wire, is wound around the part so as to form a coil, concentrating the lines of a magnetic field within the part.

The mass production of such parts proves both complex and costly, since it requires a forming, generally by pressing, of a powder of particles made of magneto-electric material, followed by a sintering, to obtain each part. Furthermore, the forming and the sintering of the powders results in a part having a substantially uniform structure and substantially isotropic magneto-dielectric properties.

From the article "Engineered meta substrate for antenna miniaturization", H. Mosallaei and K. Sarabandi, Ann. Arbor, vol. 1001, pp. 48109-2122, 2004, it is known practice to define an antenna by means of a magneto-dielectric composite structure. This type of antenna is however complex to produce, because it requires alternately stacking and linking together numerous layers of dielectric material and of hexagonal ferrite. An antenna formed by a meandering pattern etched on a dielectric or magneto-dielectric support is also known from WO 2011/036418 A1.

There is therefore a need for a new material that can be manufactured in industrial quantities, easily and inexpensively, and whose magneto-dielectric properties are anisotropic, such a material notably being able to be intended for the production of an electromagnetic antenna.

SUMMARY OF THE INVENTION

Thus, the subject of the invention is a sheet comprising a flexible support and a coating at least partially covering at least one face of the support, the support being made of a support material exhibiting dielectric properties, the coating being made of a coating material different from the support material and exhibiting magneto-dielectric properties or dielectric properties.

The sheet thus defines a composite material exhibiting anisotropic dielectric or magneto-dielectric properties, which depend on the relative permittivity of the dielectric support, on the relative permittivity and, if appropriate, on the relative permeability, of the coating, as well as on the disposition of the coating relative to the support and on the proportions in terms of volume of the coating and of the support.

As will emerge more clearly from the following, the sheet according to the invention can be manufactured simply, for example by printing, notably by screen printing, the coating on the support laid flat.

A property for example the relative permittivity or the relative permeability, is anisotropic when it varies as a function of the direction of the space according to which it is measured.

The support is "flexible", that is to say that it bows under the effect of its own weight.

The support is preferably thin, that is to say that it has a thickness at least 10 times less, even at least 100 times less, than its width and/or than its length.

In particular, the thickness of the support can be between 1 µm and 10 mm.

The support can be monolithic. As a variant, it can be multi-layered and be formed by a plurality of materials exhibiting different dielectric properties.

The support can include passing from side to side through its thickness, for example each of cylindrical-of-revolution form. The presence of voids locally modifies the relative permittivity of the support and reduces the weight of the sheet.

Moreover, the support is made of a support material exhibiting dielectric properties, that is to say that it exhibits a relative permeability equal to 1.0. It can exhibit a relative permittivity greater than 1.0, notably greater than 2.0, even greater than 3.0.

The support material is preferably chosen from among a polymer, notably thermoplastic or thermosetting, and a glass fiber-based composite and the mixtures thereof. The polymer can be chosen from a polyimide, PVS (polyvinyl siloxane), PE (polyethylene), PP (polypropylene), PS (polystyrene), ABS (acrylonitrile butadiene styrene), PC (polycarbonate) and the mixtures thereof. For example, the polymer is Kapton® marketed by the company Dupont, and the glass fiber-based composite is FR4.

The support can exhibit adhesive properties. In particular, the support can comprise an adhesive.

The coating is preferably in contact, preferably fully, with at least one face of the support.

The coating can have a thickness of between 1 µm and 2 mm, notably in a variant in which the support has a thickness of between 75 µm and 250 µm, for example approximately 125 µm.

The coating material is different from the support material. It can exhibit dielectric properties or magneto-dielectric properties.

The support material can exhibit a relative permittivity greater than 1.0, notably greater than 2.0, even greater than 3.0.

According to a first variant, the coating material can exhibit dielectric properties, that is to say that it exhibits a relative permeability equal to 1.0. The coating material can be chosen from among polyvinylidenedifluoride-trifluoroethylene (PVDF-TrFE), polystyrene (PS), poly-4-vinylphenol (PVP), polymethylmethacrylate (PMMA), polyimide (PI) and the mixtures thereof.

Preferably, according to a second variant, the coating material is magneto-dielectric. Preferably, the relative permeability of the coating material is greater than 1.0, preferably greater than 5.0, preferably greater than 10.0, better, greater than 50.0. Preferably, according to the second variant, the coating material comprises, even consists of, a ferrite.

The coating material can comprise, even consist of, a matrix and particles made of a magnetic material and/or made of a magneto-dielectric material, dispersed in the matrix.

The matrix can be an insulating organic resin. It can be a polystyrene resin, a siliconized resin, an acrylate resin, a polyurethane resin or the mixtures thereof.

The particles can be magnetic. Notably, they can be made of a metal chosen from among cobalt, iron, nickel and the alloys thereof, notably an alloy of cobalt and of iron or an alloy of iron and of nickel.

The particles can be made of an iron oxide of formula $Fe_2O_3XO$, with X chosen from among manganese, zinc, cobalt, nickel and the mixtures thereof.

The particles can be made of an alloy of copper, manganese and zinc.

They can be made of an alloy of manganese and of zinc, notably when the sheet is intended to form an antenna operating at a frequency of between 10 kHz and 1 MHz.

They can be made of an alloy of nickel and of zinc, or of zinc, of nickel and of copper, notably when the sheet is intended to form an antenna operating at a frequency of between 1 and 500 MHz.

Preferably, the coating is obtained by deposition on the support, preferably by screen printing, of an ink comprising said coating material.

The coating covers, at least partially, at least one face of the support. It can entirely cover at least one face of the support. It can cover less than 90%, even less than 80%, even less than 60%, even less than 40%, less than 20% of the area of one face of the support.

The coating can cover the two opposite faces of the support.

The coating can be continuous on the face or faces of the support that it covers.

The coating can cover the support over a defined portion extending between two opposite lateral edges of the support, which has an area which increases or decreases, for example monotonically and preferably linearly, when travelling along the support in a direction parallel to the lateral edges. For example, seen from a direction normal to the face of the support covered by the portion, the portion can have a triangular form, the vertices of which are for example disposed on the lateral edges of the sheet.

In a variant, the coating is discontinuous on the face or faces of the support that it covers. In particular, the coating can be formed by elementary patterns spaced apart from one another. At least one, and preferably all, the elementary patterns have a polyhedral form, for example chosen from among a rectangle, a hexagon, a rhomboid and a square, or a disk or ellipse form, or a wavy strip form.

The elementary patterns can each have a rectangular form, for example square.

The coating can comprise a plurality of first elementary patterns and a plurality of second elementary patterns, the first elementary patterns and the second elementary patterns having different forms.

The elementary patterns preferably define a regular arrangement, preferably periodic, according to at least one, preferably two, directions, notably according to the width and/or the length of the sheet. For example the elementary patterns define a chequerboard.

The elementary patterns can be disposed staggered relative to one another.

Furthermore, the sheet can comprise an adhesive. The adhesive can exhibit dielectric properties.

In particular, the sheet can comprise a layer comprising the adhesive, hereinafter called adhesive layer which at least partially covers the support. Thus, when the sheet is wound around a winding axis, the holding together of the consecutive turns of the duly wound sheet is facilitated.

The adhesive layer can be in contact with a face of the support opposite that with which the coating is in contact. As a variant, the coating can be sandwiched between the adhesive layer and the support.

Preferably, the sheet comprises a metallic layer. The metallic layer can at least partially, and preferably only partially, cover one face of the support. In a variant, the sheet at least partially constitutes an electromagnetic antenna. The currents induced in the metallic layer thus transform a guided wave into a propagated wave.

The metallic layer and the coating can cover one and the same face of the support or opposing faces.

Preferably, the metallic layer and the coating can cover all of the face of the support on which they are disposed.

The metallic layer and the coating can be disposed away from one another.

As a variant, the coating can be covered by the metallic layer, which preferably is continuous. According to at least one radial direction, the coating can be in contact with the facing faces of two consecutive windings of the support and according to at least one other radial direction, one of the faces of the coating can be in contact with one of said faces of the two consecutive windings and its other face can be in contact with the metallic layer.

The sheet can have varied forms. Preferably, it is thin, that is to say that its thickness is less than at least 10 times, even than at least 100 times, its width and/or its length.

In particular, the sheet can have a strip form. The strip can be of parallelepipedal form, and can have straight or wavy or notched long edges. The width of the sheet can be between 1 mm and 1 m. The length of the sheet can be between 10 mm and 1 m.

As has been described above, the sheet defines a composite material. Through its flexibility, the sheet can be deformed to form different composite structures exhibiting specific anisotropic dielectric or magneto-dielectric properties.

The invention thus relates to a composite structure comprising a sheet according to the invention wound on itself around a winding axis, or folded on itself.

Preferably, the composite structure comprises a sheet that is wound, preferably fully, on itself.

Preferably, in the wound sheet, the coating is sandwiched between the two facing faces of two consecutive windings of the support.

In the wound sheet, the coating can be in contact, preferably fully, on each of its faces, with the opposing faces of the support.

In particular, the coating can be in contact with the two facing faces of two consecutive windings of the wound sheet.

Preferably, the wound sheet defines a spiral of axis parallel to the winding axis. Preferably, the axis of the spiral coincides with the winding axis.

Preferably, the winding axis is parallel to one edge of the sheet and is at right angles to another edge of the sheet.

Preferably, in the wound sheet, the support and the coating have mutually complementary spiral forms.

Preferably, the wound sheet has a generally tubular form and preferably hollow, extending along the winding axis.

Preferably, the sheet according to the invention is wound along a winding path preferably defining a spiral at right angles to the winding axis.

The dimensions of the sheet can be chosen as a function of the application for which it is intended. For example, in an application in which the sheet is wound to at least partially define an electromagnetic antenna, the dimensions are governed by physical laws and depend part on the operating wavelength of the antenna.

The outer diameter of the wound sheet, measured in a plane transversal to the winding axis, and corresponding to the greatest dimension of the sheet in said plane, can be between 1 mm and 10 cm. The inner diameter of the wound sheet, measured in a plane transversal to the winding axis, can be between 1 mm and 10 cm. The width of the wound sheet, measured along the winding axis, can be between 1 mm and 1 m.

Moreover, the wound sheet can comprise a metal wire or a metal ribbon wound around the winding axis, and forming, for example, a helix. The wire or the ribbon is preferably in contact with the support and/or with the coating. In a variant, the wound sheet at least partially constitutes an electromagnetic antenna. The currents induced in the metal wire or the metal ribbon thus transform a guided wave into a propagated wave therein.

Moreover, the composite structure can comprise an adhesive disposed between two successive windings of the wound sheet.

The adhesive can take the form of layer at least partially, even completely, covering one face of the support. Preferably, the adhesive is in contact with one face of the support and the coating is in contact with the opposite face of the support.

The adhesive can exhibit dielectric properties.

The adhesive can be coated onto the sheet before the winding of the sheet.

The adhesive can be in contact by one of its faces with the support and by an opposite face with the coating. The adhesive increases the cohesion of the consecutive windings of the wound sheet within the composite structure.

The adhesive can be in contact with two opposite faces of the support. In particular, it can be in contact with the facing faces of two consecutive windings of the support.

In a variant in which the support is covered on one of its two opposite faces by a coating, the adhesive can be sandwiched between, even be in contact with, the coatings disposed on the opposite faces of two consecutive windings of the support.

Moreover, the composite structure can comprise a sleeve extending along the winding axis and encircling the wound sheet. Thus, an unwinding of the wound sheet is avoided. The composite structure can comprise the sleeve and the adhesive.

Preferably, the sleeve has a form complementary to that of the wound sheet. In particular, the sleeve can be in contact at least partially and preferably totally with the radially outer face of the wound sheet.

A "radial" direction is at right angles to the winding axis and intersects the winding axis. A radially inner member or surface is closer to the winding axis, according to a radial direction, than a radially outer member or surface.

The invention relates also to a composite structure comprising at least two sheets according to the invention stacked one on top of the other according to a stacking direction, the sheets each extending in a plane normal to the stacking direction, at least one sheet, and preferably all the sheets, being such that the coating covers less than 90% of one face of the support.

The composite structure can comprise more than ten, even more than 100 sheets stacked one on top of the other.

The invention relates also to an electromagnetic antenna comprising a composite structure according to the invention.

Preferably, the antenna is configured to transmit and/or receive a radiofrequency signal, preferably having a fundamental wavelength less than 10 GHz, preferably between 1 MHz and 1 GHz.

The invention relates also to a device for emitting and/or picking up an electromagnetic wave, the device comprising an electromagnetic antenna according to the invention.

Preferably, the device is chosen from among a portable telephone, a portable computer, a land vehicle, an aircraft, a boat, a satellite.

The invention relates also to a method for manufacturing a sheet according to the invention, comprising the deposition of an ink comprising the coating material on at least one face of the support, to form the coating.

The coating can be formed on a single face of the support. In a variant, the coating can be formed on each of the opposite faces of the support.

Preferably, the coating material takes the form of particles, preferably having an average size of between 50 nm and 10 μm. The "size" of a particle corresponds to the diameter of the smallest sphere which circumscribes the particle. "Average size" of the particles is understood to mean an arithmetic average of the sizes of particles. The average size of the particles can be chosen as a function of the desired coating thickness. For example, the average size of the particles can be greater than 1 μm in a variant in which the thickness of the coating is between 10 μm and 30 μm. The particles can have an average size less than 1 μm, for example in a variant in which the coating comprises an organic matrix in which the particles are dispersed.

The content by weight of coating material, expressed on the basis of the weight of the ink, can be between 30% and 60%, preferably between 40% and 50%.

Preferably, the ink comprises a solvent in which particles made of the coating material are dispersed.

Preferably, the Brookfield viscosity of the ink is between 100 mPa·s and 50000 mPa·s, preferably is less than or equal to 700 mPa·s. The Brookfield viscosity can be measured by means of a Brookfield KU-II viscosimeter marketed by the company Brookfield, after a phase of homogenization of the ink carried out at a speed of rotation of 2750 revolutions per minute for 5 minutes at 25° C. The Brookfield viscosity of the ink can be chosen as a function of the desired coating thickness. For example, for a deposition by screen printing, it is preferably between 5000 mPa·s and 25000 mPa·s, and notably less than or equal to 10000 mPa·s.

The ink can exhibit a coercive field strength of between 2000 and 4000, for example of approximately 3500.

The ink can have a density of between 1 kg/l and 4 kg/l, for example of approximately 1.3 kg/l.

The ink can exhibit a sheet resistance of approximately $10^8 \Omega$.

Preferably, the ink is deposited by means of a technique chosen from among screen printing, spin coating, blade coating, ultrasonic spray coating, slot-die coating, inkjet printing, photogravure and flexography.

More particularly preferably, the ink is deposited by screen printing. Screen printing facilitates the printing on a support of large surface area. It is particularly well suited to printing on a wide panel of dielectric materials, notably on plastic materials such as polyimides, PVS (polyvinyl siloxane), PE (polyethylene), PP (polypropylene), PS (polystyrene) or ABS (acrylonitrile butadiene styrene).

Preferably, a metallic layer as described above is formed on one, and preferably just one, face of the support. It is possible to form the metallic layer and the coating on one and the same face of the support.

The metallic layer and the coating can be formed jointly. As a variant, the coating is formed first and then the metallic layer. The metallic layer can be deposited, at least partly, even totally, on the coating.

The metallic layer can be formed by deposition of an ink comprising a metal. The metallic layer can be disposed on the support and/or the coating by one of the techniques described above, preferably by screen printing.

The method can comprise a bonding step consisting in depositing an adhesive, preferably in the form of a layer, on the support before or after the deposition of the coating.

The method can comprise a step of punching of the support, to locally modify the density of dielectric support material. The support can be punched before or after the ink has been deposited on the support.

The invention also relates to a method for forming a sheet according to the invention or obtained by the method according to the invention.

According to a first preferred variant, the forming method comprises the winding of the sheet on itself around a winding axis.

Preferably, the sheet is wound around a mandrel. The mandrel has, for example, a cylindrical-of-revolution form, and extends along the winding axis. Such a form facilitates obtaining a wound sheet generally of cylindrical-of-revolution form.

The forming method can comprise a crimping step whereby a sleeve radially encircling said wound sheet is disposed around the wound sheet.

According to a second variant, the forming method can comprise the folding of the sheet on itself, notably so as to place one face of the sheet in contact with itself. In particular, the folding can be performed along a fold line parallel to one edge of the sheet. The sheet can comprise an adhesive layer, borne by one face of the support, and the sheet is folded so as to place the adhesive layer in contact with itself.

According to a third variant, the forming method can comprise the cutting of the sheet into small plates, and the stacking of the small plates one on top of the other according to a stacking direction. Preferably, the stacking direction is at right angles to the planes in which the small plates extend respectively. Preferably, according to this other variant, the sheet is such that the coating covers less than 90% of the face of the support. The stacking step is easy to implement, since the composite structure can be manufactured from a single type of small plate which each comprises, in the form of a monolithic block, a support and a coating.

The sheet can comprise an adhesive layer borne by one face of the support and the small plates obtained by cutting of the sheet can be stacked such that the adhesive layer keeps two consecutive small plates of the stack in contact.

BRIEF DESCRIPTION OF THE FIGURES

The invention will be able to be better understood on reading the following detailed description, of nonlimiting exemplary embodiments thereof, and on studying the attached drawing in which.

DETAILED DESCRIPTION

In the interests of clarity, the relative proportions of the constituent elements of the sheet and of the composite structure have not necessarily been respected in the figures.

Figure 1:
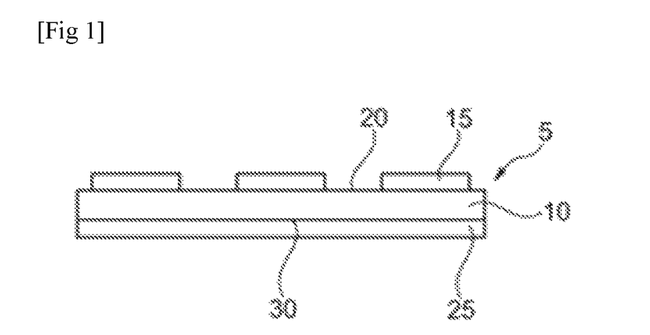
FIG. 1 represents, in cross section, an example of sheet according to the invention.

The sheet 5 illustrated in FIG. 1 comprises a support 10 and a coating 15. The coating is in contact with one face 20 of the support.

The support is for example made of Kapton® marketed by the company Dupont or of PET. In FIG. 1, the coating partially covers the face 20. As a variant, as will be observed hereinbelow, the coating can cover all of the face 20.

The sheet illustrated comprises an adhesive layer 25, disposed in contact with the face 30 of the support opposite the face 20 on which the coating is disposed. Such an adhesive layer is however optional.

Figure 2:
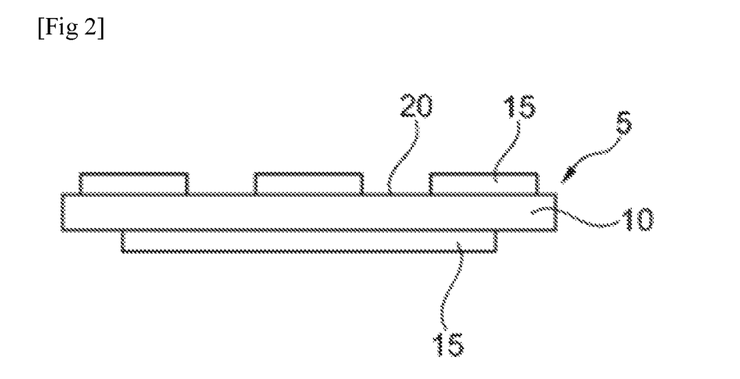
FIG. 2 represents, in cross section, another example of sheet according to the invention.

In the example of FIG. 2, the coating is disposed in contact with each of the opposite faces 20, 30 of the support.

Figure 3:
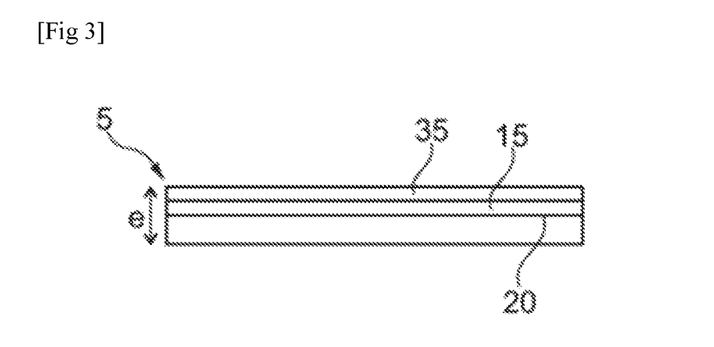
FIG. 3 represents, in cross section, yet another example of sheet according to the invention.
Figure 4:
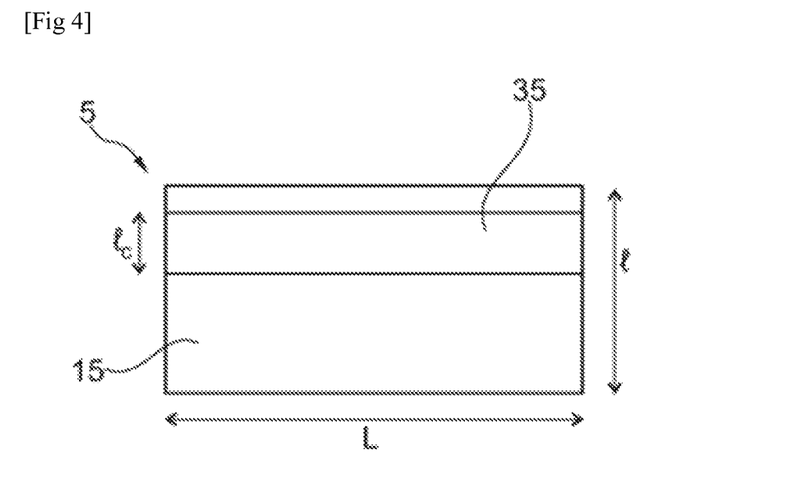
FIG. 4 represents a top view of the example illustrated in FIG. 3, FIG. 5a) to f) represent other examples of sheet, FIG. 6a) to c) represent other examples of sheet.
Figure 5:
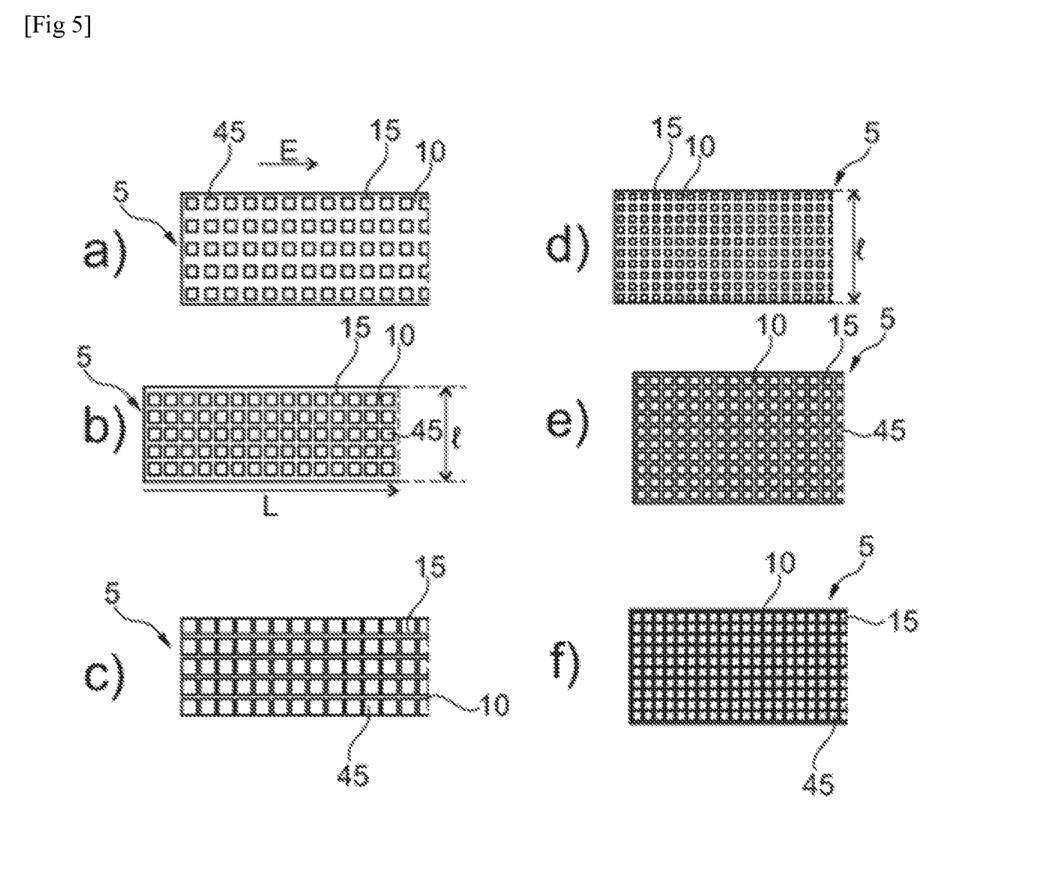

In FIG. 3, the coating covers all of the face 20 of the support with which it is in contact. Moreover, the sheet comprises a metallic layer 35, which partially covers the coating and extends over all the length of the sheet. The sheet has a parallelepipedal strip form of length L, of width l and of thickness e. The metallic layer 35, as appears in FIG. 4, is of width $l_c$ smaller than the width l of the sheet.

FIGS. 5a to 5f illustrate other examples of sheets according to the invention seen according to a direction normal to one face of the sheet. The support 10 of each of the sheets of FIGS. 5a to 5f is partially covered by the coating 15. The coating is defined by the regular repetition along the length and the width of the sheet of a square elementary pattern 45. The elementary pattern can be rectangular, or of rhomboid or of circular form.

The sheets of FIGS. 5a and 5d both have the same ratio of area covered by the coating to area of the face of the support on which the coating is disposed. In this particular case, the ratio is equal to 0.25. They differ in that they comprise a different number of elementary patterns according to the width of the sheet (5 and 10 for the examples of FIGS. 6a and 6d respectively).

For one and the same number of elementary patterns according to the width of the sheet, the examples of FIGS. 5b-c and 5e-f respectively illustrate a variation of the ratio of area occupied by the coating to area of the face of the support on which the coating is disposed, in this particular case equal to 0.5 and 0.75.

According to another example illustrated in FIGS. 6a to 6c, the elementary patterns 45 are disposed staggered relative to one another along the length of the sheet. For each of the sheets illustrated, the number of elementary patterns according to the width of the sheet is identical and equal to 5, and the ratio of area covered by the elementary patterns to the area of the face on which they are disposed is 0.25, 0.50 and 0.75 for the examples of FIGS. 6a to 6c respectively.

Figure 7:
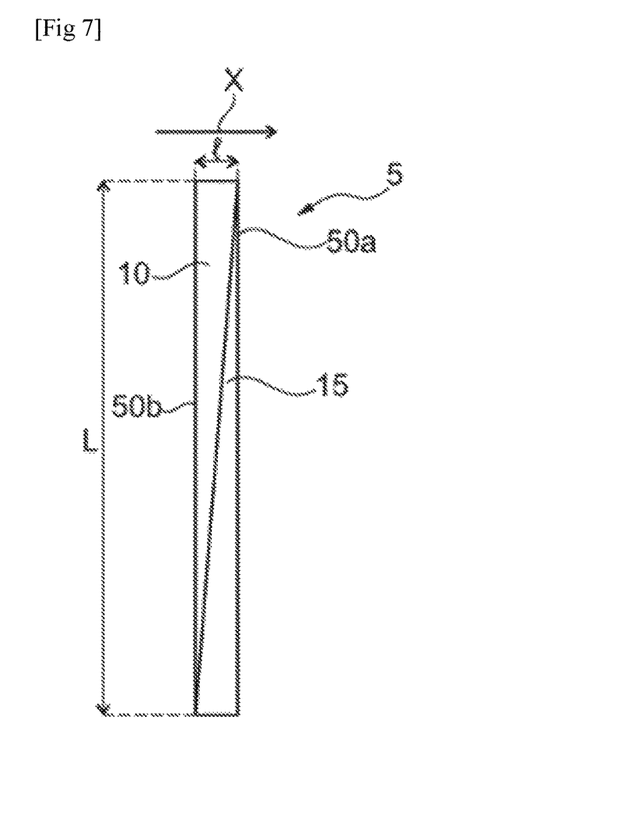
FIG. 7 is a top view of a sheet illustrating an example of particular arrangement of the coating on the support.

FIG. 7 illustrates another example of implementation of the invention. The coating 15 extends progressively from one long edge 50a to the opposite long edge 50b moving lengthwise along the length L of the sheet. The area coated by the coating changes linearly between the two long edges of the sheet.

Figure 8:
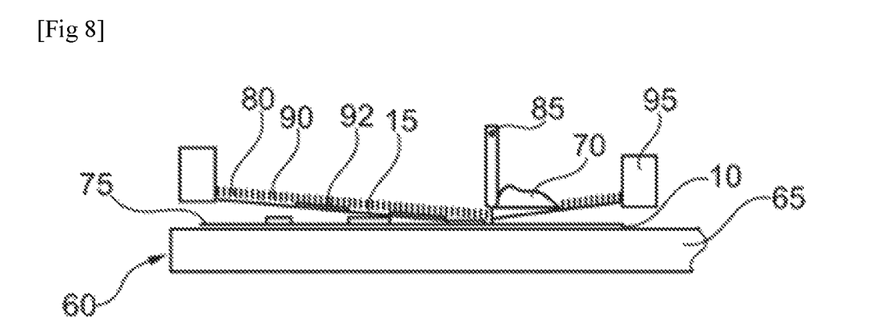
FIG. 8 illustrates an example of implementation of the method for manufacturing a sheet according to the invention.

To manufacture the sheets of the examples illustrated in FIGS. 1 to 7, it is possible to proceed as illustrated in FIG. 8 and as detailed hereinbelow.

A screen printing device 60 is fed by means of the flexible support 10 made of a support material with the dielectric properties as described previously, for example made of Kapton®. The support 10 is disposed on a printing table 65.

To perform a screen printing, it is possible to use the X-nano magnetic ink marketed by the company DNC Materials, or the Nanum Ink ink marketed by the company Nanum, or one of the inks H400, H270, P2189 and WL330 marketed by the company Mulann.

The ink 70 comprising the coating material, for example a magneto-dielectric material, is deposited on one face 75 of the support 20. In the variant in which the aim is to partially cover the face of the support, the ink is deposited through a mask 80 and a blade 85 made of polyethylene is applied to scrape the ink on the surface of the mask so as to ensure a uniform deposition thickness.

The mask is disposed on a screen 90 formed by a fabric 92 stretched on a frame 95, for example made of steel. The fabric is formed by metal or polyester wires. The wires define meshes through which the ink can flow. The ink is then deposited only in zones where there is no superposition with the mask.

The ink is then dried, by evaporation of the solvent that it contains. The drying can be done at ambient temperature, or during a bake carried out at a temperature of between 100° C. and 135° C., for example for a duration of 30 minutes. The bake can be implemented by irradiating the ink by means of a laser. It can be photonic, that is to say that it is implemented by means of a light source, for example a flash UV lamp. Advantageously, the photonic bake heats up the solvent to evaporation and sinters the particles of the ink to one another without damaging the support. The photonic bake can be performed by means of the PulseForge 3200 lamp marketed by the company NovaCentrix.

There is thus obtained a flat sheet formed by the support on which the coating 15 is deposited.

Optionally, the sheet is then cut so as to have a determined width and length.

The sheet can be formed to form all or part of a composite structure.

Figure 9:
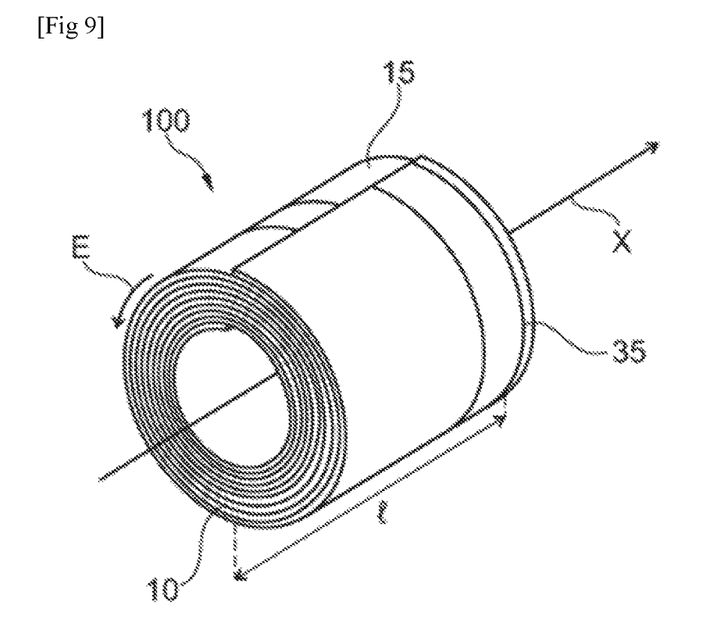
FIG. 9 represents, according to a perspective view, a composite structure obtained by winding of the sheet illustrated in FIGS. 3 and 4.
Figure 10:
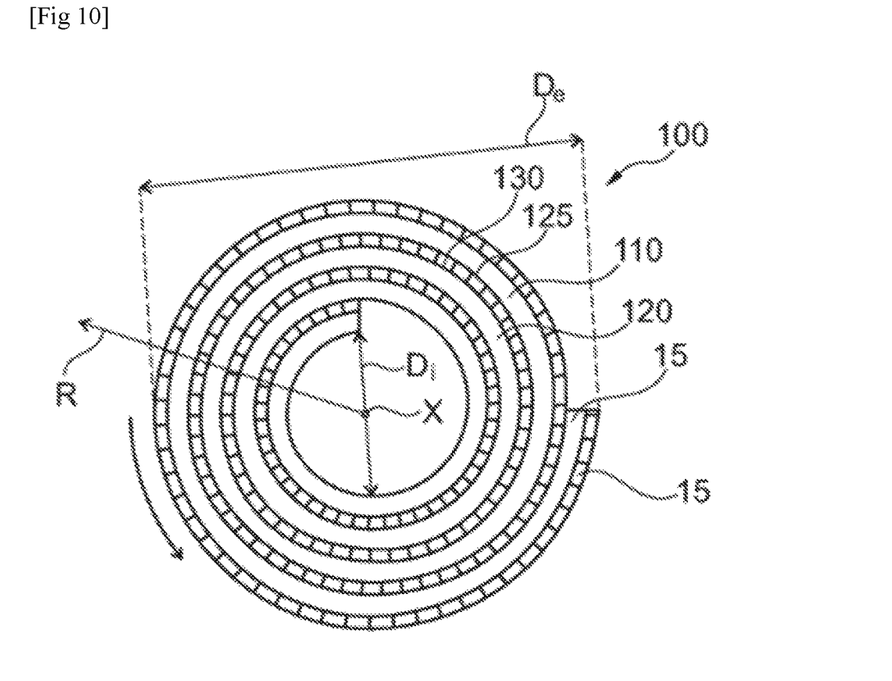
FIG. 10 represents, according to a respectively axial view, a composite structure obtained by winding of the sheet illustrated in FIGS. 3 and 4.

FIGS. 9 and 10 illustrate an example of composite structure 100 comprising a wound sheet 100 formed by the spiral-winding on itself, around a winding axis X, of the sheet represented in FIGS. 3 and 4.

The wound sheet has a generally tubular and hollow form of axis X.

For example, it has:
a width l, measured along the winding axis, of between 1 mm and 1 m, for example equal to to 10 mm,
an outer diameter De, measured according to a radial direction, of between 2 mm and 40 mm, for example equal to 5 mm, and
an inner diameter Di, measured according to a radial direction, of between 1 mm and 40 mm, for example equal to 4.5 mm.

The wound sheet is defined by the winding of the sheet according to a winding path characterized by the arrow E, around the winding axis X. As can be observed in FIG. 9, the winding path E according to which the sheet is wound defines a spiral of axis X.

The coating 15 is sandwiched between two consecutive windings 110, 120 of the support, whatever the windings considered. It is in contact with each of the facing faces 125,130 of the two consecutive windings.

The wound sheet thus exhibits uniform and anisotropic magneto-dielectric or dielectric properties, although each winding defines a set with heterogeneous magneto-dielectric or dielectric properties.

Notably, the wound sheet can have a permittivity tensor $\varepsilon$ and/or a permeability tensor $\mu$, expressed within a cylindrical reference frame centered on the winding axis, equal respectively to:

$$\varepsilon = \begin{pmatrix} \varepsilon_0\varepsilon_1 & & \\ & \varepsilon_0\varepsilon_2 & \\ & & \varepsilon_0\varepsilon_3 \end{pmatrix} \quad [\text{Math 1}]$$

and $$\mu = \begin{pmatrix} \mu_0\mu_1 & & \\ & \mu_0\mu_2 & \\ & & \mu_0\mu_3 \end{pmatrix} \quad [\text{Math 2}]$$

With $\varepsilon_0$ and $\mu_0$ being the permeability and the permittivity of the vacuum and $\varepsilon_i$ and $\mu_i$ with i=1 to 3 being the components according to the axial, radial and orthoradial directions of the permeability and of the permittivity of the wound sheet.

Moreover, the metallic layer 35 is, for its part, also spiral-wound around the winding axis. In a preferred variant in which the composite structure forms all or part of an electromagnetic antenna, the currents which are induced in the metallic layer transform a guided wave into a propagated wave.

Figure 11:
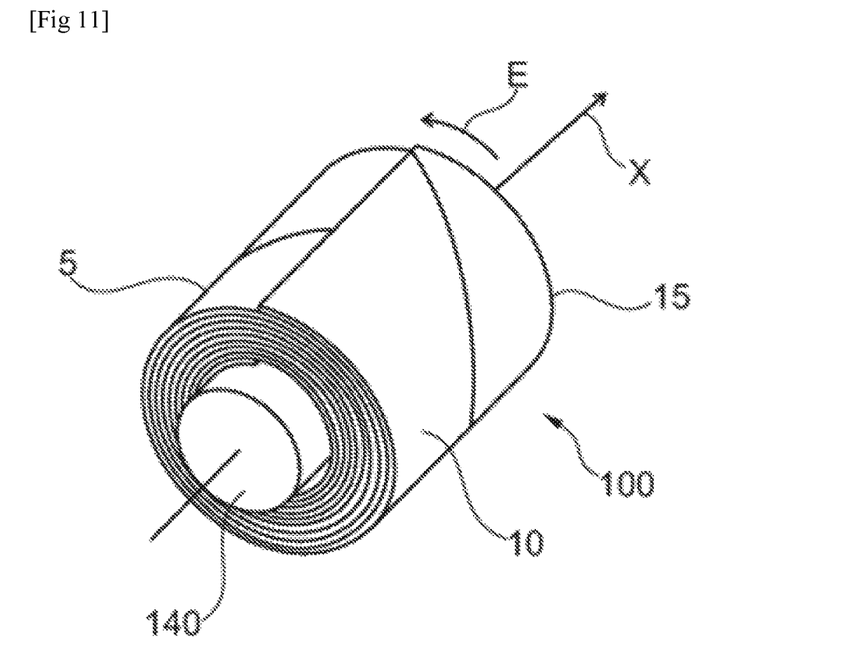
FIG. 11 represents, according to a perspective view, a composite structure obtained by winding of the sheet illustrated in FIG. 7.

The composite structure illustrated in FIG. 11 comprises the sheet illustrated in FIG. 7 spiral-wound around the winding axis X. Moreover, the sheet is wound around a mandrel 70, cylindrical-of-revolution, with which it is in contact.

Because of the increasing area of the surface of the support covered by the coating when moving along the wound sheet around the winding path E, the composite structure illustrated in FIG. 10 exhibits an anisotropic and heterogeneous magneto-dielectric or dielectric behavior, dependent notably on the radial distance to the winding axis and on the position according to the winding axis.

Figure 6:
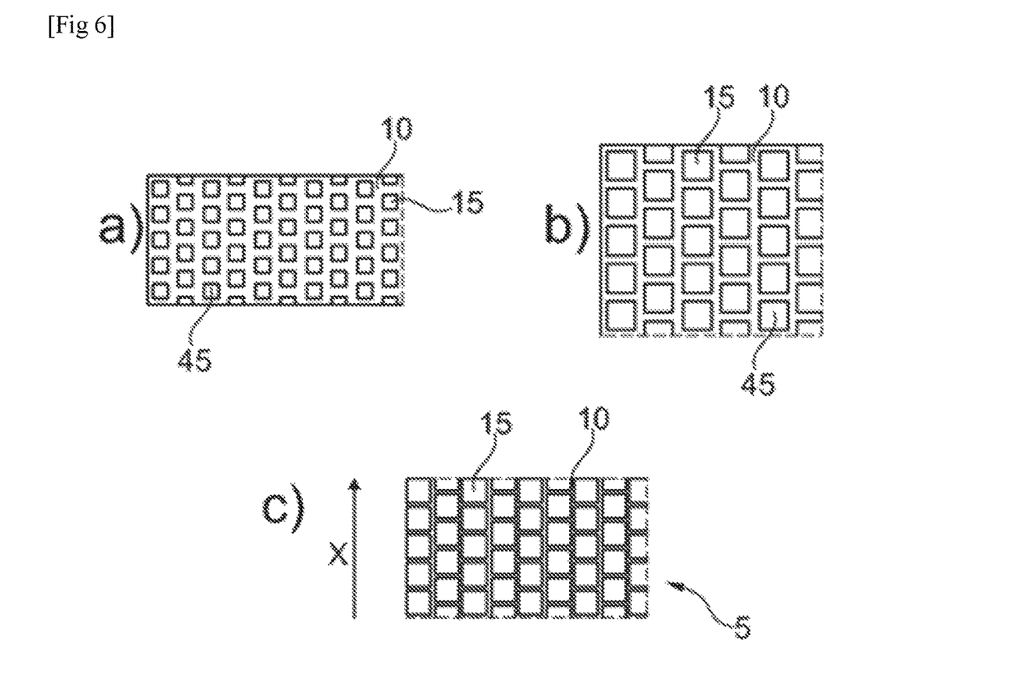
Figure 12:
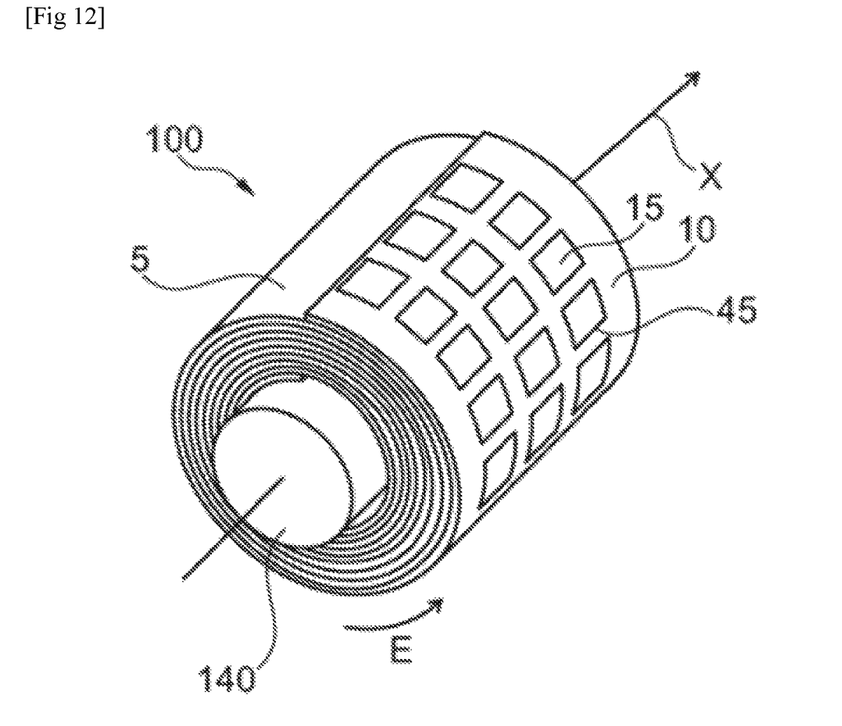
FIG. 12 represents, according to a perspective view, a composite structure obtained by winding of the sheet illustrated in FIG. 5.

The composite structure illustrated in FIG. 12 is obtained by winding of a sheet as illustrated in FIG. 6. The sheet of FIG. 6 thus wound thus defines a composite material exhibiting a local ratio of relative permittivity to relative permeability that changes periodically both angularly around and along the winding axis X respectively.

Figure 13:
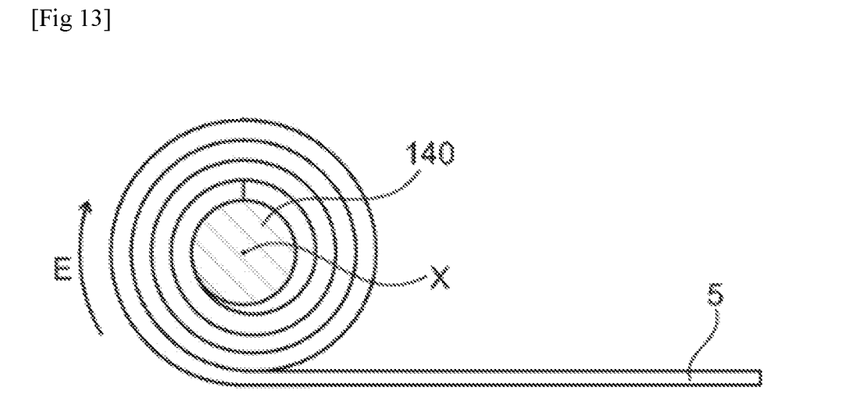
FIG. 13 illustrates an example of implementation of the forming method according to the invention.

FIG. 13 illustrates an example of forming of a sheet according to the invention to produce a wound sheet as described above.

A sheet according to the invention is placed in contact with a mandrel 140 of axis X and cylindrical-of-revolution, linked for example to a motor. The mandrel is rotated so as to wind the sheet on itself to form the wound sheet of a composite structure according to the invention.

Figure 15:
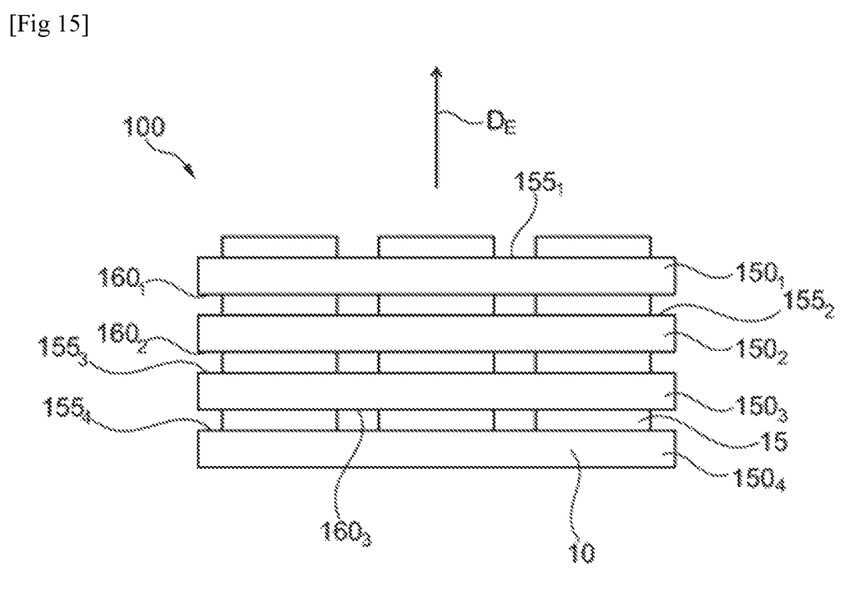
FIG. 15 represents an example of composite structure.

The forming method can comprise the cutting of a sheet according to the invention, for example according to the width of the sheet, so as to form a plurality of small plates $150_{1-4}$. The small plates are then stacked one on top of the other, as illustrated in FIG. 15, according to a stacking direction $D_E$ normal to one of respective faces $155_{1-4}$ so as to form the composite structure 100. In order to ensure the cohesion between the small plates within the composite structure, the sheet can comprise an adhesive layer disposed on the face $155_{2-4}$ covered by the coating or on the face $160_{1-3}$ which is opposite to it. As a variant, prior to the assembling of the small plates with one another, an adhesive can be coated between two consecutive small plates of the stack.

Figure 14:
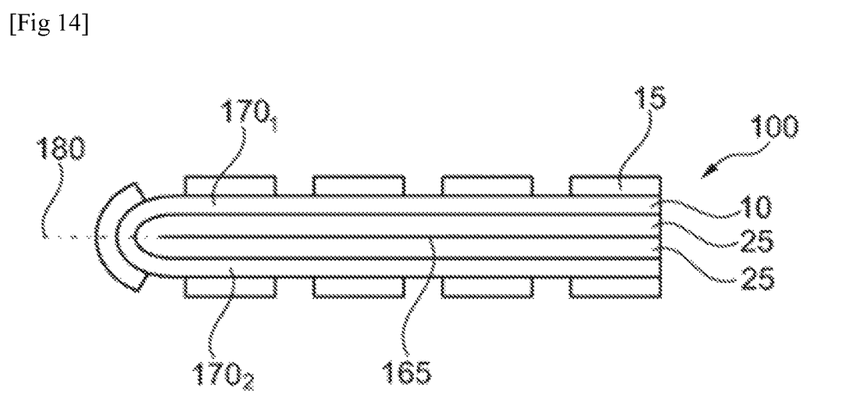
FIG. 14 represents an example of composite structure.

The forming method can comprise the folding of the sheet on itself, for example so as to bring a face 165 of the sheet into contact with itself, as is illustrated in FIG. 14. In this example, the sheet comprises an adhesive layer 25 disposed on one face of the support 10 opposite to that covered by the coating 15. During the folding step, the adhesive layer 25 is brought into contact with itself, so as to bind together the parts $170_{1-2}$ of the sheet disposed on either side of the fold line 180.

As emerges clearly from the present description, the invention makes it possible to manufacture, simply and in industrial quantities, a sheet and a composite structure, which exhibit anisotropic and/or heterogeneous dielectric or magneto-dielectric properties.

Obviously, the invention is not limited to the embodiments and implementations presented above by way of illustration.

The invention claimed is:

1. A composite structure comprising a sheet comprising a flexible support and a coating at least partially covering at least one face of the support, the support being made of a support material being dielectric, the coating being made of a coating material different from the support material and being magneto-dielectric exhibiting both a relative permittivity and a relative permeability that are each greater than 1.0, the sheet being wound on itself around a winding axis or folded on itself.

2. The composite structure according to claim 1, the sheet being wound along a winding path defining a spiral at right angles to the winding axis.

3. The composite structure according to claim 2, having a generally tubular form extending along the winding axis.

4. A device for emitting or picking up an electromagnetic wave, the device comprising an electromagnetic antenna comprising the composite structure according to claim 3.

5. The composite structure according to claim 1, the support material being a thermoplastic or thermosetting polymer, selected from the group consisting of a polyimide, polyvinyl siloxane, polyethylene, polypropylene, polystyrene, acrylonitrile butadiene styrene and the mixtures thereof, or being a glass fiber-based composite.

6. The composite structure according to claim 1, wherein the coating entirely covers at least one face of the support.

7. The composite structure according to claim 1, wherein the coating partially covers one face of the support.

8. The composite structure according to claim 7, having elementary patterns defining a regular arrangement according to at least one direction.

9. The composite structure according to claim 7, the coating covering less than 90% of the area of a face of the support.

10. The composite structure according to claim 1, comprising a metallic layer at least partially covering one face of the support.

11. A method comprising:
manufacturing a sheet comprising a flexible support and a coating at least partially covering at least one face of the support, the support being made of a support material being dielectric, the coating being made of a coating material different from the support material and being magneto-dielectric exhibiting both a relative permittivity and a relative permeability that are each greater than 1.0,
depositing an ink comprising the coating material on at least one face of the support, to form the coating, and
forming the sheet, comprising the winding of the sheet on itself around a winding axis, or folding the sheet on itself.

12. The method according to claim 11, wherein, during the manufacturing of the sheet, the ink is deposited by a technique selected from the group consisting of screen printing, spin coating, blade coating, ultrasonic spray coating, slot-die coating, inkjet printing, flexography and photogravure.

* * * * *